(12) United States Patent
Wang

(10) Patent No.: US 10,446,794 B2
(45) Date of Patent: Oct. 15, 2019

(54) TOP-EMITTING ORGANIC LIGHT-EMITTING DEVICE AND COMPONENT THEREOF

(71) Applicant: BOE TECHNOLOGY GROUP CO., LTD., Beijing (CN)

(72) Inventor: Dan Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/761,493

(22) PCT Filed: Oct. 10, 2017

(86) PCT No.: PCT/CN2017/105493
§ 371 (c)(1),
(2) Date: Mar. 20, 2018

(87) PCT Pub. No.: WO2018/171166
PCT Pub. Date: Sep. 27, 2018

(65) Prior Publication Data
US 2019/0058163 A1  Feb. 21, 2019

(30) Foreign Application Priority Data
Mar. 24, 2017  (CN) .......................... 2017 1 0184216

(51) Int. Cl.
*H01L 51/56*  (2006.01)
*H01L 51/52*  (2006.01)
(Continued)

(52) U.S. Cl.
CPC ...... *H01L 51/5262* (2013.01); *H01L 51/5206* (2013.01); *H01L 51/5221* (2013.01);
(Continued)

(58) Field of Classification Search
CPC . H01L 51/5262; H01L 51/56; H01L 51/5206; H01L 51/5221; H01L 51/5237; H01L 27/3232
(Continued)

(56) References Cited

U.S. PATENT DOCUMENTS 9,224,981 B2  12/2015  Kang
2008/0203908 A1*  8/2008  Hasegawa et al. ... H01L 51/524
                                                          313/504
(Continued)

FOREIGN PATENT DOCUMENTS

CN    102244202 A    11/2011
CN    102751447 A    10/2012
(Continued)

OTHER PUBLICATIONS

English translation of International Search Report dated Jan. 10, 2018, issued in counterpart International Application No. PCT/CN2017/105493 (10 pages).
(Continued)

*Primary Examiner* — Thinh T Nguyen
(74) *Attorney, Agent, or Firm* — Westerman, Hattori, Daniels & Adrian, LLP

(57) ABSTRACT

A component of top-emitting organic light-emitting device includes an anode, a light-emitting layer, a cathode, a light extraction layer, and an encapsulation layer. The light-emitting layer is arranged over the anode. The cathode is arranged over the light-emitting layer. The light extraction layer is arranged over the cathode. The encapsulation layer is arranged over the light extraction layer. A material of the light extraction layer includes an inorganic material.

17 Claims, 13 Drawing Sheets

(51) Int. Cl.
*H01L 27/32* (2006.01)
*H01L 51/50* (2006.01)
*H01L 51/00* (2006.01)

(52) U.S. Cl.
CPC .......... *H01L 51/5237* (2013.01); *H01L 51/56* (2013.01); *H01L 27/3232* (2013.01); *H01L 51/0072* (2013.01); *H01L 51/504* (2013.01)

(58) Field of Classification Search
USPC ............. 257/40, 59, 72; 438/82, 99, 48, 128
See application file for complete search history.

(56) References Cited

U.S. PATENT DOCUMENTS

| | | | | |
|---|---|---|---|---|
| 2014/0061598 | A1* | 3/2014 | Kim et al. | .......... H01L 51/5253 257/40 |
| 2015/0279912 | A1* | 10/2015 | Negishi | ............... H01L 27/3246 257/40 |
| 2016/0233275 | A1* | 8/2016 | Toyoda | ................. H01L 51/504 |

FOREIGN PATENT DOCUMENTS

| | | |
|---|---|---|
| CN | 103460434 A | 12/2013 |
| CN | 103730594 A | 4/2014 |
| CN | 103779379 A | 5/2014 |
| CN | 103855185 A | 6/2014 |
| CN | 104425542 A | 3/2015 |

OTHER PUBLICATIONS

CN Office Action dated May 5, 2019, issued in counterpart CN Application No. 201710184216.1, with English translation (15 pages).

* cited by examiner

TOP-EMITTING ORGANIC LIGHT-EMITTING DEVICE AND COMPONENT THEREOF

CROSS-REFERENCE TO RELATED APPLICATION

This PCT patent application claims priority to Chinese Patent Application No. 201710184216.1, filed on Mar. 24, 2017, the entire contents of which are incorporated herein by reference.

TECHNICAL FIELD

The present disclosure generally relates to the field of organic electroluminescent display technology and, more particularly, to a component of top-emitting organic light-emitting diode (OLED) device and a top-emitting OLED device.

BACKGROUND

Organic Light-Emitting Diode (OLED) devices may become next generation display devices as substitutes for liquid crystal display devices, for having advantages of, e.g., active light-emitting capability, good temperature characteristics, low power consumption, fast response, flexibility, ultra-thin thickness, and low cost. OLED flat panel display technology is moving toward a phase at which mass production technology is increasingly mature and market demand is rapidly growing.

In the existing technology, a small organic molecule material used in a light extraction layer in an OLED device may be sensitive to moisture and oxygen. Further, the light extraction layer and a thin film encapsulation (TFE) layer above the light extraction layer may have a poor refractive index matching, resulting in a loss of light through the TFE layer.

SUMMARY

In one aspect, the present disclosure provides a component of top-emitting organic light-emitting device. The component includes an anode, a light-emitting layer over the anode, a cathode over the light-emitting layer, a light extraction layer over the cathode, and an encapsulation layer over the light extraction layer. A material of the light extraction layer includes an inorganic material.

Another aspect of the present disclosure provides a method for fabricating a component of top-emitting organic light-emitting device. The method includes forming an anode over a substrate, forming a light-emitting layer over the anode, forming a cathode over the light-emitting layer, forming a light extraction layer over the cathode, and forming an encapsulation layer over the light extraction layer. A material of the light extraction layer includes an inorganic material.

BRIEF DESCRIPTION OF THE FIGURES

The following drawings are merely examples for illustrative purposes according to various disclosed embodiments and are not intended to limit the scope of the present disclosure.

Figure 9:
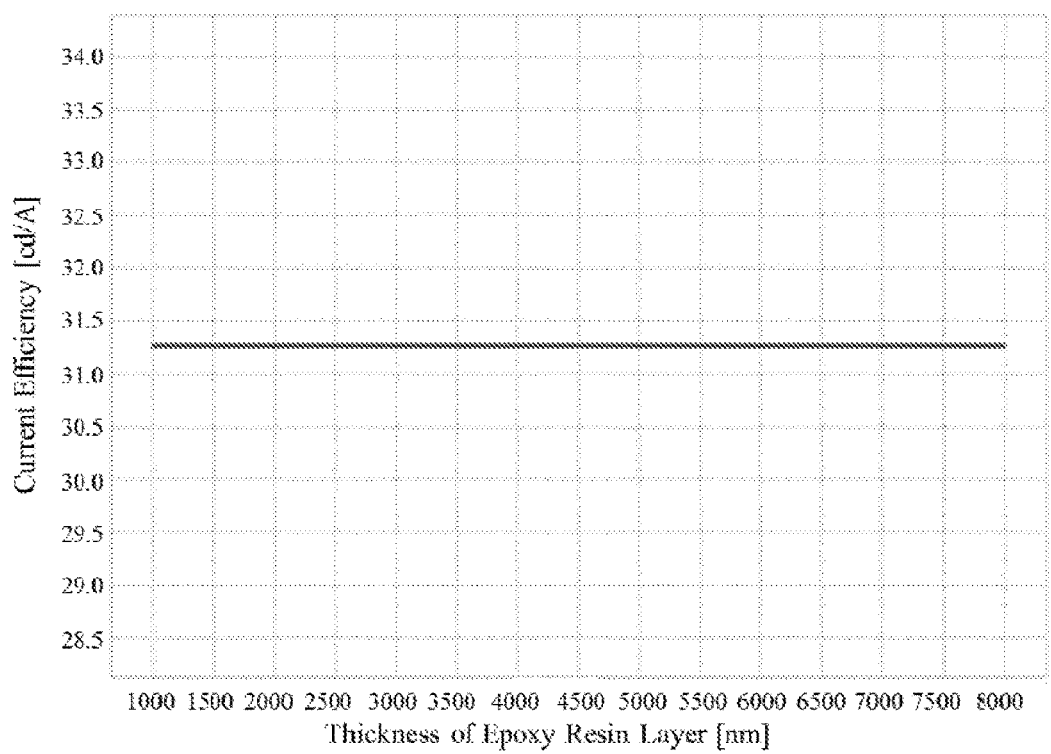
Figure 10:
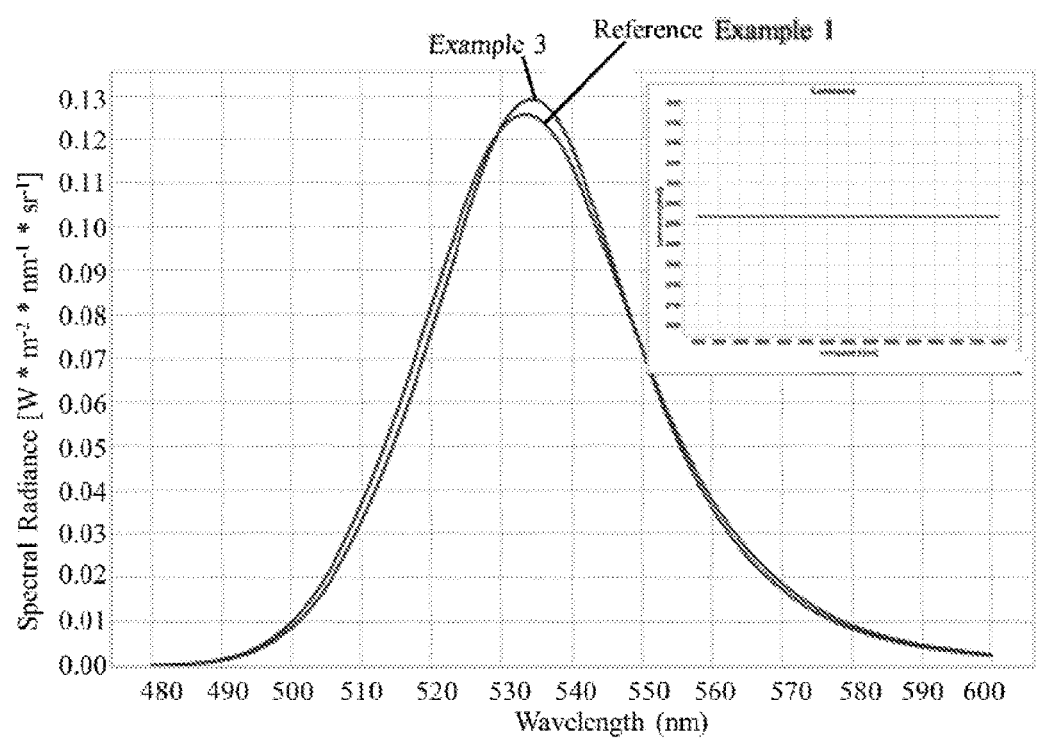
Figure 11:
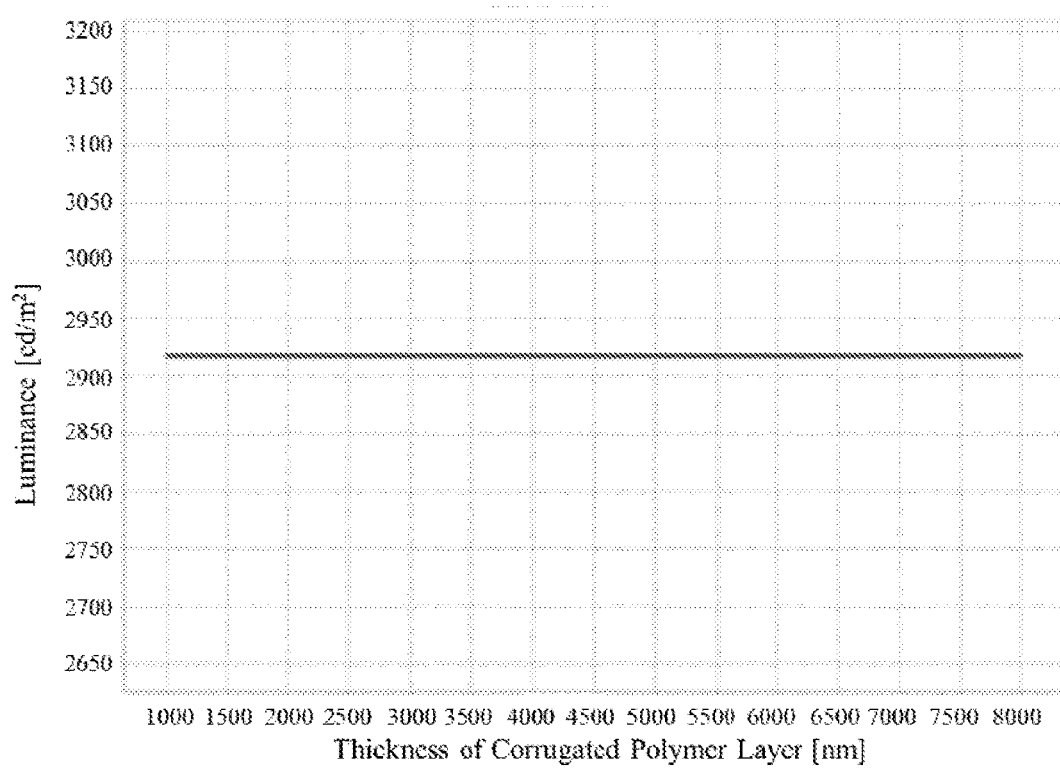
Figure 12:
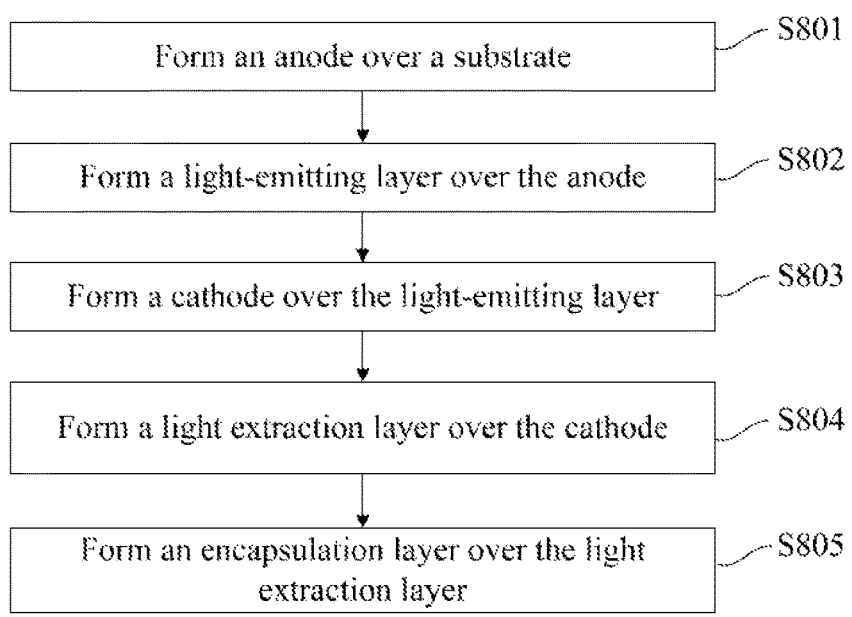
Figure 13:
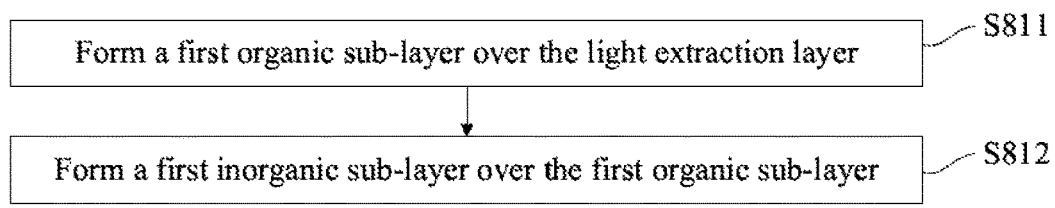
Figure 14:
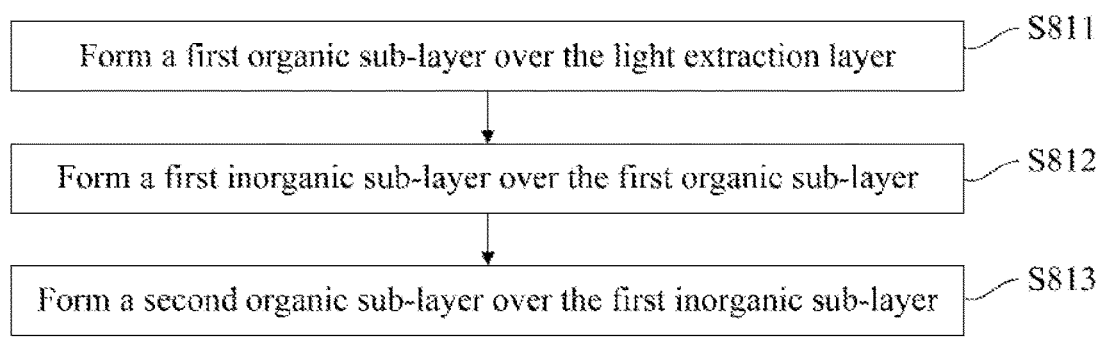
Figure 15:
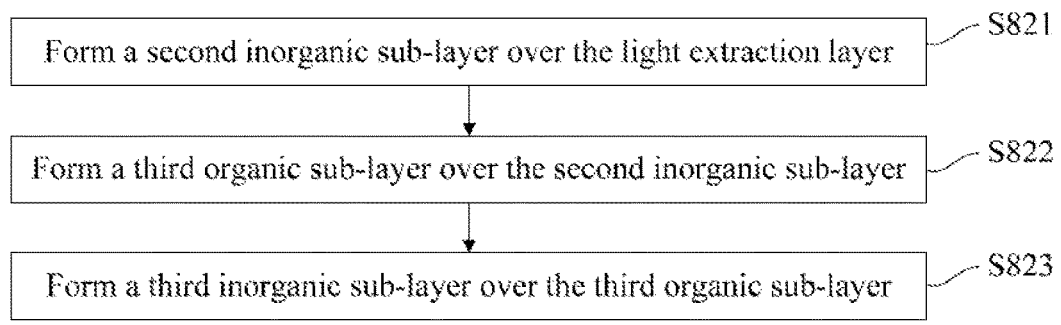

FIG. illustrates a comparison between optical output results of another exemplary component of top-emitting OLED device and a reference component of top-emitting OLED device;

FIG. 9 illustrates a view of current efficiency versus thickness of epoxy resin layer;

FIG. 10 illustrates a comparison between optical output results of another exemplary component of top-emitting OLED device and a reference component of top-emitting OLED device;

FIG. 11 illustrates a view of luminance versus thickness of corrugated polymer layer;

FIG. 12 illustrates a flow chart of an exemplary fabrication method for an exemplary component of top-emitting organic light-emitting device according to various disclosed embodiments of the present disclosure;

FIG. 13 illustrates a flow chart of another exemplary fabrication method for an exemplary component of top-emitting organic light-emitting device according to various disclosed embodiments of the present disclosure;

FIG. 14 illustrates a flow chart of another exemplary fabrication method for an exemplary component of top-emitting organic light-emitting device according to various disclosed embodiments of the present disclosure; and FIG. 15 illustrates a flow chart of another exemplary fabrication method for an exemplary component of top-emitting organic light-emitting device according to various disclosed embodiments of the present disclosure.

DETAILED DESCRIPTION

Exemplary embodiments of the disclosure will now be described in more detail with reference to the drawings. It is to be noted that, the following descriptions of some embodiments are presented herein for purposes of illustration and description only, and are not intended to be exhaustive or to limit the scope of the present disclosure.

The aspects and features of the present disclosure can be understood by those skilled in the art through the exemplary embodiments of the present disclosure further described in detail with reference to the accompanying drawings.

According to light-emitting directions, OLED devices can be divided into three types: bottom-emitting OLED devices, dual-side-emitting OLED devices, and top-emitting OLED devices. A bottom-emitting OLED device is an OLED device that emits light through a substrate of the OLED device. A dual-side-emitting OLED device is an OLED device that emits light through both the substrate and a top of the device. A top-emitting OLED device is an OLED device that emits light through the top of the device.

The top-emitting OLED devices have broad applications, and may be have one of two types of structures; a structure having independent Red-Green-Blue (RGB) color pixels, and a structure including a white light source and color films. The top-emitting OLED device may have a high luminous efficiency, a high color purity, etc. Within the top-emitting OLED device, a waveguide mode and a surface plasma mode may exist, causing an external quantum efficiency of the top-emitting OLED device generally to be only at approximately 20%. The external quantum efficiency may be improved by methods such as an external light extraction or an internal light extraction. The external light extraction method may generally use an organic capping layer having a high refractive index as a light extraction layer. The light extraction layer may include an aromatic-ring organic material that is sensitive to moisture and oxygen or another organic material that is sensitive to moisture and oxygen. Thus, an inorganic/organic/inorganic thin film structure may generally need to be deposited over the light extraction layer of the top-emitting OLED device to serve as a thin film encapsulation (TFE) layer for the electrode material and the light extraction layer, and to shield moisture and oxygen.

In the existing technology, the light extraction layer may generally use a small organic molecule material that can be formed by evaporation, e.g., N,N'-Bis-(1-naphthalenyl)-N, N'-bis-phenyl-(1,1'-biphenyl)-4,4'-diamine (NPB), 4,4'-Bis (N-carbazolyl)-1,1'-biphenyl (CBP), etc. The organic small molecular materials may be sensitive to moisture and oxygen. Further, the light extraction layer and the TFE layer located above the light extraction layer may have a poor refractive index matching, hindering light escape. Generally, a loss of the light through the TFE layer may be approximately 8%.

Figure 1:
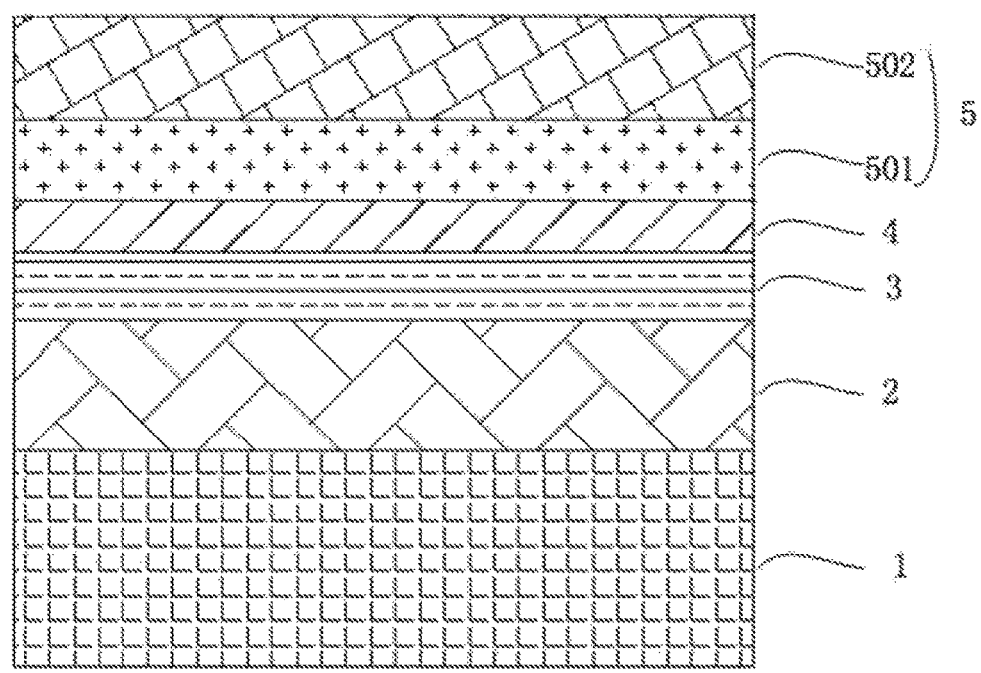
FIG. 1 illustrates a schematic view of an exemplary component of top-emitting organic light-emitting diode (OLED) device according to various disclosed embodiments of the present disclosure.

The present disclosure provides a component of top-emitting organic light-emitting diode (OLED) device. FIG. 1 illustrates a schematic view of an exemplary component of top-emitting OLED device according to various disclosed embodiments of the present disclosure. As shown in FIG. 1, the exemplary component includes an anode 1, a light-emitting layer 2 disposed over the anode 1, a cathode 3 disposed over the light-emitting layer 2, a light extraction layer 4 disposed over the cathode 3, and an encapsulation layer 5 disposed over the light extraction layer 4. A material of the light extraction layer 4 may include a metal oxide. The encapsulation layer 5 includes a first organic sub-layer 501 disposed over the light extraction layer 4 and a first inorganic sub-layer 502 disposed over the first organic sub-layer 501.

In some embodiments, a material of the light extraction layer in the component of top-emitting OLED device of the present disclosure may include a metal oxide. The metal oxide may have a higher refractive index than an organic material having an aromatic ring used in the light extraction layer in the existing technology.

The metal oxide may have more a stable chemical property than the organic material having an aromatic ring in the existing technology. The metal oxide may not easily have a chemical reaction with moisture and oxygen in the air, making the chemical properties of the light extraction layer more stable.

The metal oxide may have a smaller molecular size and more closely packed molecules, and may be hard for moisture and oxygen to pass through. Accordingly, the light extraction layer may protect the underlying electrodes and light-emitting layer.

The light extraction layer may have a refractive index matching that of the encapsulation layer, which includes the first organic sub-layer having a relatively low refractive index and the first inorganic sub-layer having a relatively high refractive index. The first organic sub-layer has the relatively low refractive index and the first inorganic sub-layer has the relatively high refractive index such that the first organic sub-layer and the first inorganic sub-layer can match with each other to form a unit for improving light transmittance.

In embodiments of the present disclosure, the anode, the light-emitting layer, and the cathode are not restricted, and may be selected according to various application scenarios. For example, materials of the anode, the light-emitting layer, and the cathode of the disclosure may include materials of an anode, a light-emitting layer, and a cathode of a top-emitting OLED device in the existing technology, respectively. The material of the anode may include, for example, silver (Ag), indium-tin-oxide/silver/indium-tin-oxide (ITO/Ag/ITO), or nickel-chromium alloy. The material of the light-emitting layer can include, for example, tris(8-quinolinolato)aluminum (Alq3), which may improve an electron injection at a cathode of the top-emitting OLED device. Generally, the light-emitting layer may include different light-emitting regions, e.g., a red light-emitting region emitting red light, a green light-emitting region emitting green light, and a blue light-emitting region emitting blue light. The material of the cathode can include, for example, a translucent cathode material. Further, the material of the cathode can include, for example, copper phthalocyanine (CuPc) or magnesium-silver alloy.

Further, in some embodiments, the metal oxide may include at least one of aluminum oxide, zinc oxide, zirconium oxide, or titanium oxide. A refractive index of a light extraction layer containing the metal oxide may generally range from approximately 1.7 to approximately 2.1. In some embodiments, the metal oxide may include zinc oxide. For example, the light extraction layer containing zinc oxide may have a relatively high refractive index of approximately 2.0. In some embodiments, a thickness of the light extraction layer may be, for example, approximately 50 nm.

Atomic Layer Deposition (ALD) method may be used to prepare a dense atomic-layer deposition film by controlling precursors to enter into a reaction chamber alternately. Due to the existence of time difference, two precursors may not exist simultaneously in the reaction chamber. Thus, reactions in the manner of chemical vapor deposition (CVD) may be prevented. After a reaction involving a first precursor is completed, an inert gas, such as argon, may be introduced to expel at least some of one or more first reaction products, e.g., one or more reaction by-products, and excess precursor. Only one layer of atoms may be grown per reaction due to a self-limiting nature of the reaction.

For example, for depositing an $Al_2O_3$ film, with a substrate, such as a Si substrate, covered with a layer of hydroxyl, a precursor trimethylaluminum (TMA) may be introduced into the reaction chamber in a form of pulses. TMA may react with the hydroxyl on the Si substrate. The reaction product (—O—)$Al(CH_3)_2$ may be adsorbed at the surface, and a gas reaction product $CH_4$ and excess precursor TMA may be expelled out from the reaction chamber by introducing an inert gas. Then a precursor water vapor may be introduced to react with the reaction product adsorbed at the surface, i.e., (—O—)$Al(CH_3)_2$. After the reaction has reached saturation, at least some of one or more reaction products, e.g., one or more reaction by-products, and excess water vapor may be expelled out of the reaction chamber by introducing an inert gas. At this stage, one cycle is completed. Then a next cycle may continue.

The reaction is shown as the follows.

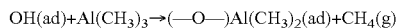

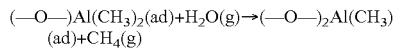

A deposition temperature of an $Al_2O_3$ film may generally be, for example, approximately 80° C. A thickness of the film may depend on the number of cycles. In some embodiments, a 1 nm-thick film may need 10 cycles to complete.

In some embodiments, for preparing a ZnO film, diethyl zinc as a zinc precursor and water as an oxygen precursor may be introduced alternately into a reaction chamber to form the ZnO film. In each reaction cycle, an exposure time of a precursor may be approximately 60 s, a reaction environment may include $N_2$, and a temperature may be approximately 130°.

Further, in some embodiments, a material of the first organic sub-layer may include, for example, an epoxy resin. The first organic sub-layer may have a smaller refractive index than the light extraction layer, such that a refractive index gradient may be formed to suppress a total reflection of light. Further, a thickness of the first organic sub-layer may be, for example, approximately 1 μm to approximately 8 μm, and a refractive index of the first organic sub-layer may be approximately 1.56.

Further, a material of the first inorganic sub-layer may include, for example, at least one of a silicon oxide, a silicon nitride, or a silicon oxynitride. The first inorganic sub-layer may have a refractive index higher than the first organic sub-layer, such that a light transmittance may be improved. Further, a material of the first inorganic sub-layer may include, for example, a silicon nitride (SiN). In some embodiments, a refractive index of the first inorganic sub-layer may be, for example, approximately 1.84. In some embodiments, a thickness of the first inorganic sub-layer may be, for example, approximately 800 nm.

Figure 2:
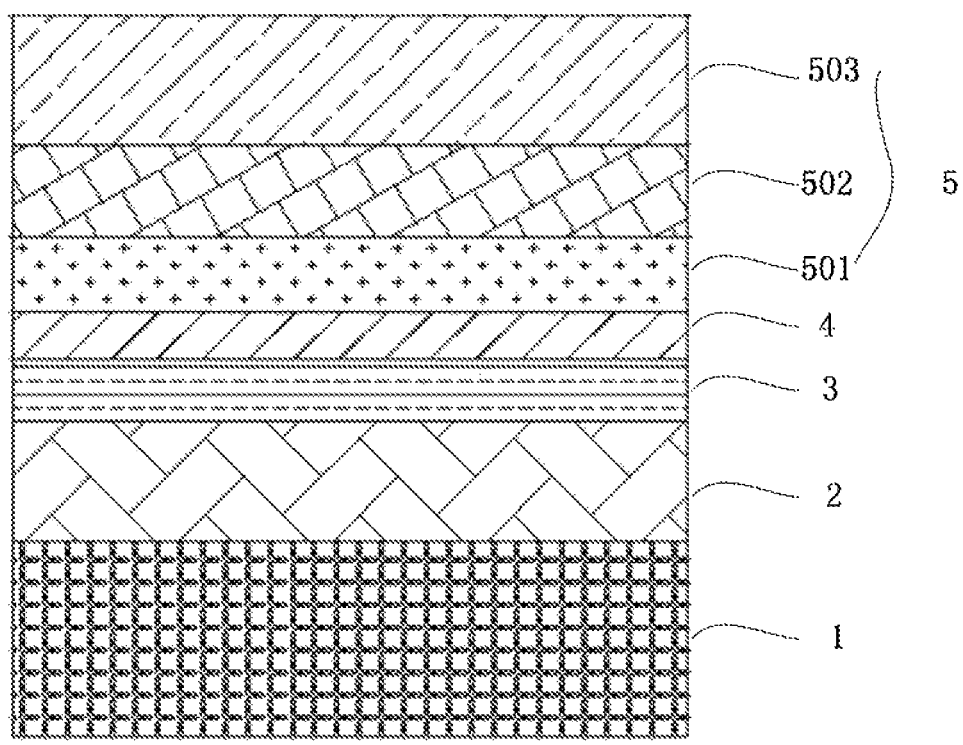
FIG. 2 illustrates a schematic view of another exemplary component of top-emitting OLED device according to various disclosed embodiments of the present disclosure.

FIG. 2 illustrates a schematic view of another exemplary component of top-emitting OLED device according to various disclosed embodiments of the present disclosure. The component shown in FIG. 2 is similar to the component shown in FIG. 1, except that in the component shown in FIG. 2, the encapsulation layer 5 further includes a second organic sub-layer 503 disposed over the first inorganic sub-layer 502. A material of the second organic sub-layer 503 can include, for example, a corrugated polymer. The corrugated polymer may include a self-assembled regular array formed by at least one of polystyrene, polymethylmethacrylate (PMMA), phenolic resin, or another multi-block polymer having a similar structure. In some embodiments, a thickness of the second organic sub-layer may generally be approximately 1 μm to approximately 8 μm, and may have nearly no influence on light output. The corrugated polymer may have a periodic wrinkle structure, and may have a scattering effect on outputted light, thereby reducing a total reflection of light and improving a transmittance of light.

Figure 3:
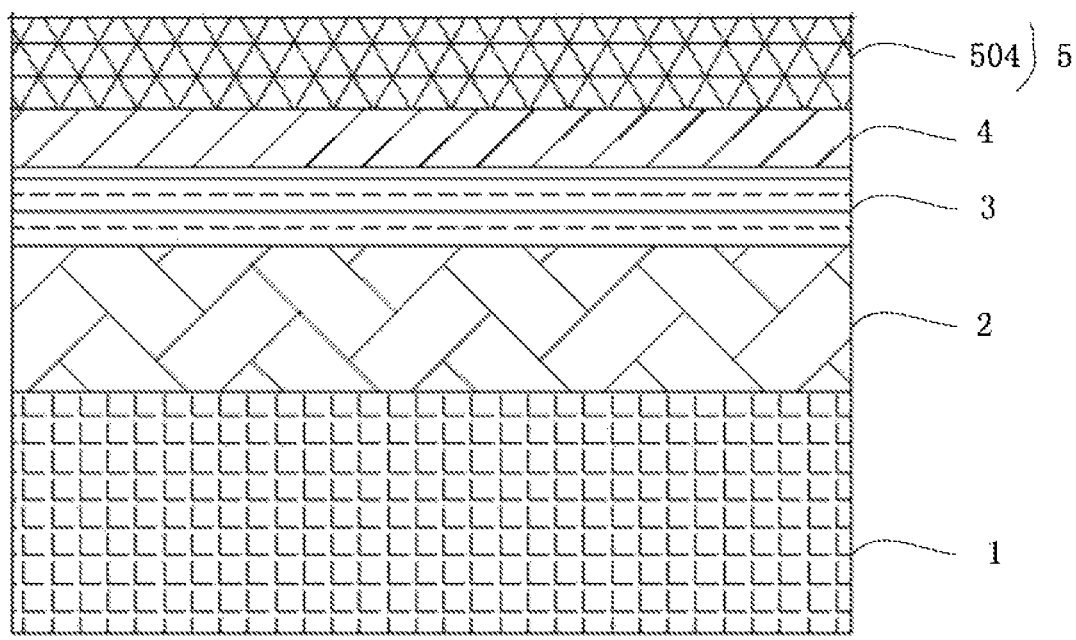
FIG. 3 illustrates a schematic view of another exemplary component of top-emitting OLED device according to various disclosed embodiments of the present disclosure.

FIG. 3 shows another exemplary component of top-emitting OLED device consistent with embodiments of the disclosure. As shown in FIG. 3, the component includes the anode 1, the light-emitting layer 2 disposed over the anode 1, the cathode 3 disposed over the light-emitting layer 2, the light extraction layer 4 disposed over the cathode 3, and the encapsulation layer 5 disposed over the light extraction layer 4. A material of the light extraction layer 4 may include a metal oxide. In the example shown in FIG. 3, the encapsulation layer 5 includes a third organic sub-layer 504, and a material of the third organic sub-layer may include a corrugated polymer.

In embodiments of the present disclosure, a material of the light extraction layer in the component of top-emitting OLED device of the present disclosure may include a metal oxide having a higher refractive index than an organic material having an aromatic ring used in the light extraction layer in the existing technology.

The metal oxide may have a more stable chemical property than the organic material having an aromatic ring in the existing technology. The metal oxide may not easily have a chemical reaction with moisture and oxygen in the air, making the chemical properties of the light extraction layer more stable.

The metal oxide may have a smaller molecular size and more closely packed molecules, and may be hard for moisture and oxygen to pass through. Accordingly, the light extraction layer may protect the underlying electrodes and light-emitting layer.

The light extraction layer, in conjunction with the third organic sub-layer in the encapsulation layer above the light extraction layer, may suppress a total reflection of light and improve a transmittance of light.

In embodiments of the present disclosure, the anode, the light-emitting layer, and the cathode are not restricted, and may be selected according to various application scenarios. Materials of the anode, the light-emitting layer, and the cathode may include, for example, materials of an anode, a light-emitting layer, and a cathode of a top-emitting OLED device in the existing technology, respectively. For the anode, the light-emitting layer, and the cathode, reference can be made to the above descriptions of the anode, the light-emitting layer and the cathode in described embodiments.

Further, in some embodiments, the metal oxide may include at least one of an aluminum oxide, a zinc oxide, a zirconium oxide, or a titanium oxide. A refractive index of the light extraction layer containing a metal oxide may generally be approximately 1.7 to approximately 2.1. In some embodiments, the metal oxide may include a zinc oxide. For example, the light extraction layer containing zinc oxide may have a relatively high refractive index of approximately 2.0. In some embodiments, a thickness of the light extraction layer may be, for example, approximately 50 nm.

Further, in some embodiments, a material of the third organic sub-layer may include a corrugated polymer. For structures and properties of the third organic sub-layer, reference can be made to descriptions of structures and properties of the second organic sub-layer shown in FIG. 2, which are not repeated here.

Figure 4:
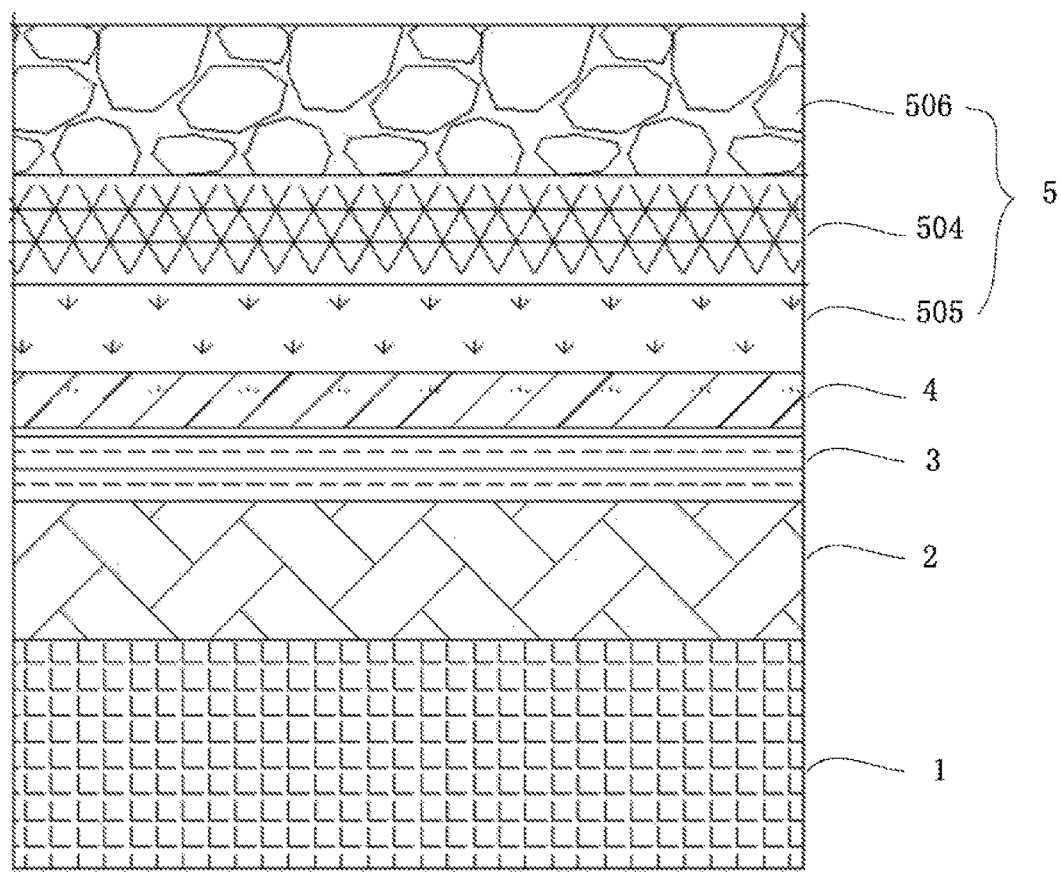
FIG. 4 illustrates a schematic view of another exemplary component of top-emitting OLED device according to various disclosed embodiments of the present disclosure.

FIG. 4 illustrates a schematic view of another exemplary component of top-emitting OLED device according to various disclosed embodiments of the present disclosure. In some embodiments, in order to prevent a solvent from penetrating into the electrode material through the light extraction layer during a fabrication of the third organic sub-layer, as shown in FIG. 4, the encapsulation layer 5 further includes a second inorganic sub-layer 505 between the light extraction layer 4 and the third organic sub-layer 504. A material of the second inorganic sub-layer 505 may include, for example, at least one of a silicon oxide, a silicon nitride, or a silicon oxynitride. The second inorganic sub-layer 505 not only may prevent the solvent from penetrating into the electrode material, but also may serve to further encapsulate the electrodes and the light-emitting layer. Further, the second inorganic sub-layer 505 may have little influence on a light transmittance.

Further, in some embodiments, in order to enhance a encapsulation performance of the encapsulation layer 5 on the anode, the light-emitting layer, and the cathode, and in order to prevent moisture and oxygen from chemically reacting with materials of the anode, the light-emitting layer, and the cathode, as shown in FIG. 4, the encapsulation layer 5 further includes a third inorganic sub-layer 506 disposed over the third organic sub-layer 504. The third inorganic sub-layer 506 may include, for example, at least one of a silicon oxide, a silicon nitride, or a silicon oxynitride.

The present disclosure provides a top-emitting OLED device that includes any one of components of top-emitting OLED device consistent with the disclosure, e.g., any one of the exemplary components described above. The component may be arranged over a substrate of the top-emitting OLED device. The top-emitting OLED device may have a relatively high light transmittance.

Figure 5:
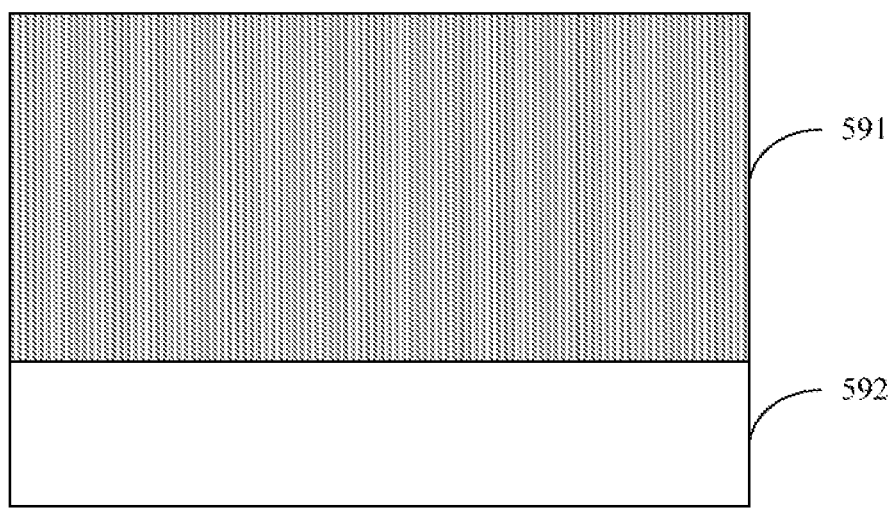
FIG. 5 illustrates a schematic view of an exemplary top-emitting OLED device according to various disclosed embodiments of the present disclosure.

FIG. 5 illustrates a schematic view of an exemplary top-emitting OLED device 500 according to various disclosed embodiments of the present disclosure. As shown in FIG. 5, the exemplary top-emitting OLED device 500 includes a component 591 of the disclosure. The component 591 can be, for example, any one of the above-described exemplary components. The top-emitting OLED device 500 may further include other suitable structures. For example, the top-emitting OLED device 500 includes a substrate 592. Any top-emitting OLED device including a component consistent with the disclosure is within the scope of the present disclosure.

In some embodiments, the components consistent with the disclosure may be formed in vacuum.

Comparisons between Examples of the disclosure and a Reference Example are described below.

Example 1, i.e., Example 1 of the disclosure, is described below.

A substrate is subject to ultrasonic cleaning in acetone, ethanol, and deionized water successively for 10 minutes, and then dried in an oven.

After the cleaned substrate is placed in a vacuum chamber, an anode is formed over the substrate by magnetron sputtering. The anode can include, for example, ITO/Ag/ITO layers.

The prepared structure on the substrate is then placed in a vacuum evaporation chamber, and a vacuum level is held at approximately $10^{-5}$ Pa. A material is heated and sublimated by a heat source. A light-emitting layer is formed over the anode by evaporation. For the light-emitting layer, detailed layer structure can include, for example, hole injection sub-layer/hole transport sub-layer/light-emitting sub-layer/electron transport sub-layer/electron injection sub-layer.

Then, a cathode is formed over the light-emitting layer by vacuum evaporation. A thickness of the cathode can be, for example, approximately 14 nm. A material of the cathode can be, for example, a magnesium-silver alloy. A mass ratio of magnesium to silver can be, for example, approximately 2:8 or approximately 9:1.

A light extraction layer is deposited over the cathode by atomic layer deposition (ALD). A thickness of the light extraction layer may be, for example, approximately 50 nm. A material of the light extraction layer may include, for example, zinc oxide.

A first organic sub-layer is deposited over the light extraction layer by ink jet printing. A thickness of the first organic sub-layer may be, for example, approximately 5 µm. A material of the first organic sub-layer may include, for example, epoxy resin.

A first inorganic sub-layer is deposited over the first organic sub-layer by plasma enhanced chemical vapor deposition (PECVD). The first inorganic sub-layer may have a thickness of approximately 800 nm. A material of the first inorganic sub-layer may include silicon nitride.

A component of top-emitting OLED device is thus formed.

Example 2, i.e., Example 2 of the disclosure, is described below.

Example 2 differs from Example 1 in that, in Example 2, the component of top-emitting OLED device further includes a second organic sub-layer. Polystyrene is self-assembled over the first inorganic sub-layer layer-by-layer by spin coating to form the second organic sub-layer containing a corrugated polymer.

Example 3, i.e., Example 3 of the disclosure, is described below.

Example 3 of the disclosure has the same anode, light-emitting layer, and cathode as Example 1 of the disclosure. The difference between Example 3 of the disclosure and Example 1 of the disclosure is described below.

A second inorganic sub-layer is deposited over the light extraction layer by PECVD. A material of the second inorganic sub-layer may include silicon nitride.

Polymethylmethacrylate (PMMA) is self-assembled over the second inorganic sub-layer layer-by-layer by spin coating to form a third organic sub-layer containing a corrugated polymer;

A third inorganic sub-layer is deposited over the third organic sub-layer by PECVD. A material of the third inorganic sub-layer may include a silicon nitride.

A component of a top-emitting OLED device is thus formed.

Reference Example 1 is described below.

The anode, the light-emitting layer and the cathode of Reference Example 1 are the same as the anode, the light-emitting layer, and the cathode of Example 1 to Example 3 of the disclosure. Reference Example 1 has a different light extraction layer and encapsulation layer as compared to Example 1 to Example 3 of the disclosure. Differences are described in the following.

A light extraction layer is formed over the cathode by vacuum evaporation. A material of the light extraction layer may include N,N'-Bis-(1-naphthalenyl)-N,N'-bis-phenyl-(1,1'-biphenyl)-4,4'-diamine (NPB).

A thin film encapsulation layer including silicon nitride/hexamethyldisiloxane (HMDSO)/silicon oxynitride is formed over the organic light-emitting layer.

A component of top-emitting OLED device is thus formed.

Figure 6:
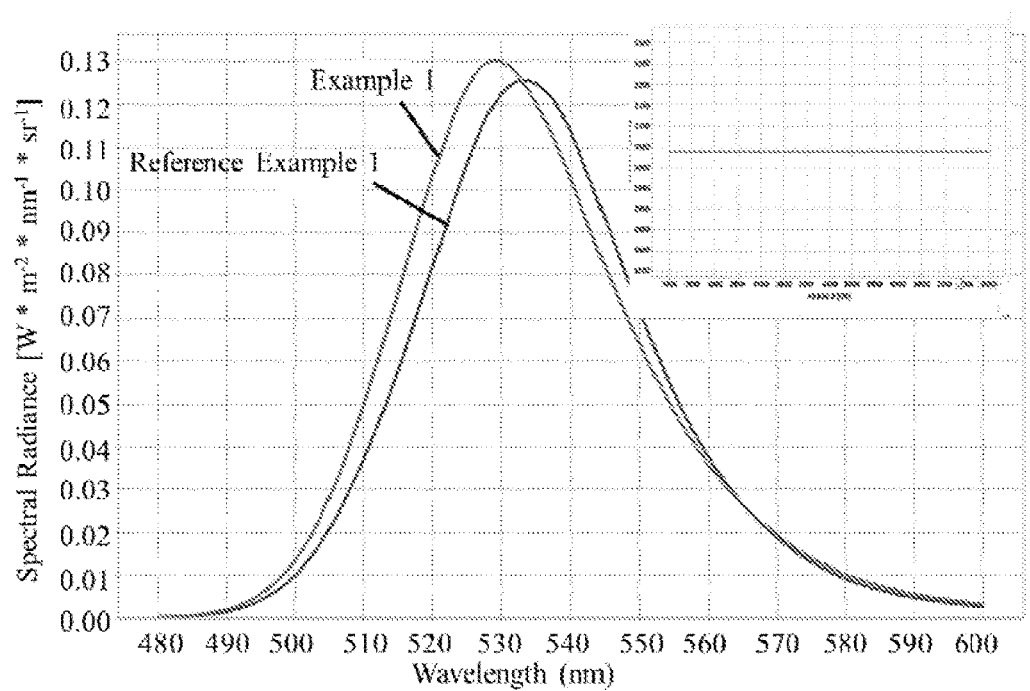
FIG. 6 illustrates a comparison between optical output results of an exemplary component of top-emitting OLED device and a reference component of top-emitting OLED device.
Figure 8:
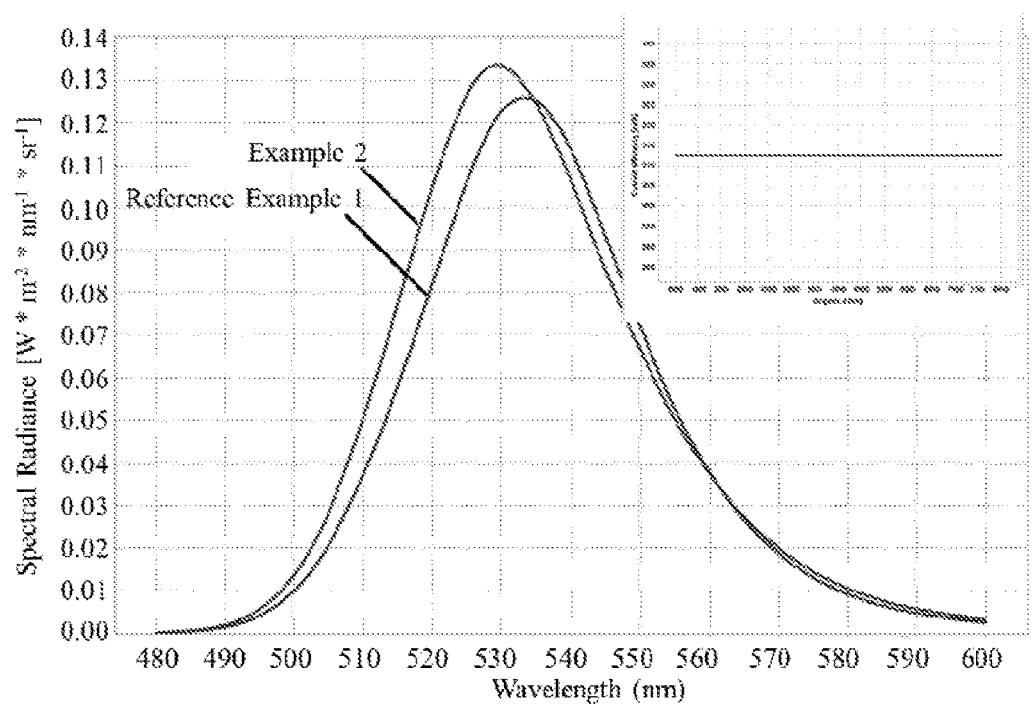

Optical outputs are simulated for Example 1 to Example 3 of the disclosure and Reference Example 1 by using 'setfos' application software. As shown in FIGS. 6, 8, and 10, the components of the top-emitting OLED devices of the present disclosure (Example 1 to Example 3 of the disclosure) have higher transmittances than the component of top-emitting OLED device in the existing technology (Reference Example 1).

Figure 7:
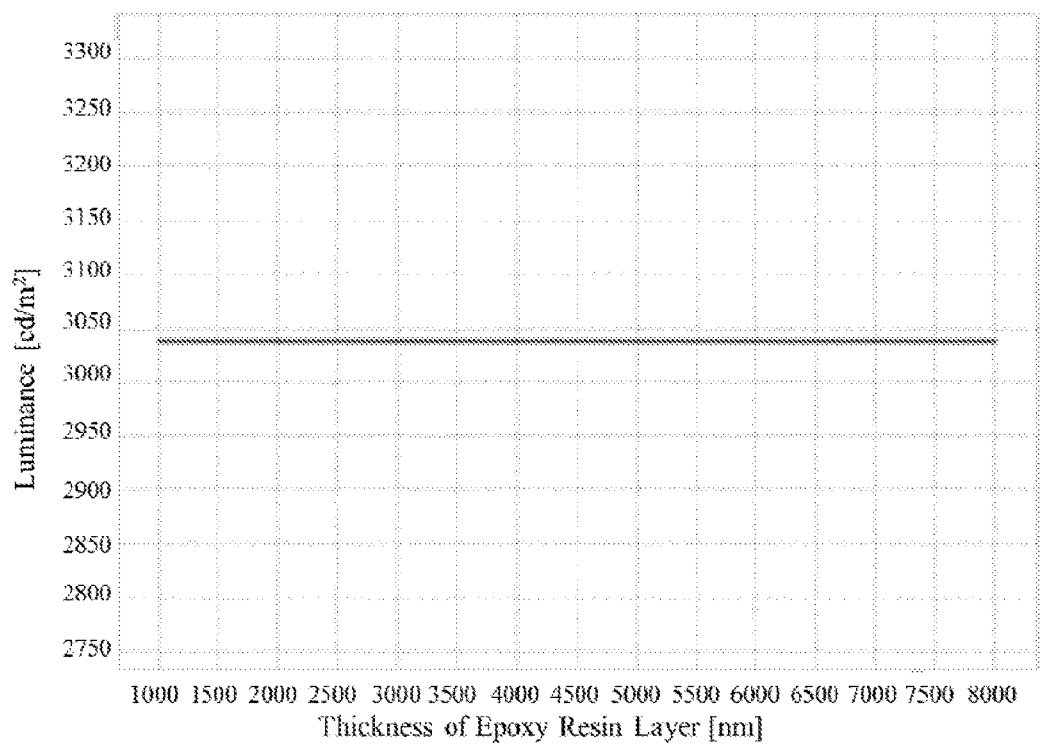
FIG. 7 illustrates a view of luminance versus thickness of epoxy resin layer.

FIG. 6 illustrates a comparison between optical output results of an exemplary component of top-emitting OLED device (Example 1) and the reference component of top-emitting OLED device (Reference Example 1). FIG. 7 illustrates a zoomed-in view of an inset in FIG. 6. The inset is located in an upper right portion of FIG. 6. FIG. 7, i.e., the inset in FIG. 6, illustrates a view of luminance versus thickness of epoxy resin layer in Example 1. As shown in FIG. 7, in a range of approximately 1 µm to 8 µm, the thickness of the first organic sub-layer, i.e., the epoxy resin layer, almost has no influence on a luminance of the exemplary component of top-emitting OLED device.

FIG. 8 illustrates a comparison between optical output results of another exemplary component of top-emitting OLED device (Example 2) and the reference component of top-emitting OLED device (Reference Example 1). FIG. 9 illustrates a zoomed-in view of an inset in FIG. 8. The inset is located in an upper right portion of FIG. 8. FIG. 9, i.e., the inset in FIG. 8. illustrates a view of current efficiency versus thickness of epoxy resin layer in Example 2. As shown in FIG. 9, in a range of approximately 1 µm to 8 µm, the thickness of the first organic sub-layer, i.e., the epoxy resin layer, almost has no influence on the current efficiency of the exemplary component of top-emitting OLED device.

FIG. 10 illustrates a comparison of optical output results of another exemplary component of top-emitting OLED device (Example 3) and the reference component of top-emitting OLED device (Reference Example 1). FIG. 11 illustrates a zoomed-in view of an inset in FIG. 10. The inset is located in an upper right portion of FIG. 10. FIG. 11 illustrates a view of luminance versus thickness of corrugated polymer layer in Example 3. As shown in FIG. 11, in a range of approximately 1 µm to 8 µm, the thickness of the third organic sub-layer, i.e., the corrugated polymer layer, almost has no influence on the luminance of the exemplary component of top-emitting OLED device.

The disclosure also provides a fabricating method for the component of top-emitting organic light-emitting device consistent with the disclosure. FIG. 12 illustrates a flow chart of an exemplary fabrication method for an exemplary component of top-emitting organic light-emitting device according to various disclosed embodiments of the present disclosure. With reference to FIG. 12, the fabrication method is described below.

At S801, an anode is formed over a substrate. In some embodiments, for example, the substrate may be placed in a vacuum chamber, and an anode may be formed over the substrate by magnetron sputtering. The anode can include, for example, ITO/Ag/ITO layers.

At S802, a light-emitting layer is formed over the anode. The light-emitting layer may be formed over the anode by, for example, evaporation. The light-emitting layer can include, for example, structure of hole injection sub-layer/hole transport sub-layer/light-emitting sub-layer/electron transport sub-layer/electron injection sub-layer.

At S803, a cathode is formed over the light-emitting layer. The cathode may be formed over the light-emitting layer by, for example, vacuum evaporation.

At S804, a light extraction layer is formed over the cathode. A material of the light extraction layer may include an inorganic material. The light extraction layer may be deposited over the cathode by, for example, atomic layer deposition (ALD). The inorganic material may include, for example, a metal oxide.

In some embodiments, the metal oxide may include at least one of an aluminum oxide, a zinc oxide, a zirconium oxide, or a titanium oxide. A refractive index of the light extraction layer containing a metal oxide may generally be approximately 1.7 to approximately 2.1. In some embodiments, the metal oxide may include a zinc oxide. For example, the light extraction layer containing zinc oxide may have a relatively high refractive index of approximately 2.0. In some embodiments, a thickness of the light extraction layer may be, for example, approximately 50 nm.

At S805, an encapsulation layer is formed over the light extraction layer.

In some embodiments, for example, forming the encapsulation layer over the light extraction layer at S805 may include processes described below, with reference to FIG. 13. FIG. 13 illustrates a flow chart of another exemplary fabrication method for an exemplary component of top-emitting organic light-emitting device according to various disclosed embodiments of the present disclosure.

At S811, a first organic sub-layer is formed over the light extraction layer. The first organic sub-layer may be deposited over the light extraction layer by, for example, ink jet printing.

At S812, a first inorganic sub-layer is formed over the first organic sub-layer. The first inorganic sub-layer may be deposited over the first organic sub-layer by, for example, plasma enhanced chemical vapor deposition (PECVD). A material of the first inorganic sub-layer may include, for example, silicon nitride.

In some embodiments, for example, forming the encapsulation layer over the light extraction layer at S805 may include processes described below in addition to the above-described processes S811 and S812, with reference to FIG. 14. FIG. 14 illustrates a flow chart of another exemplary fabrication method for an exemplary component of top-emitting organic light-emitting device according to various disclosed embodiments of the present disclosure.

At S813, a second organic sub-layer is formed over the first inorganic sub-layer. For example, a polystyrene may be self-assembled over the first inorganic sub-layer layer-by-layer by spin coating to form the second organic sub-layer containing a corrugated polymer.

In some embodiments, a material of the first organic sub-layer may include, for example, an epoxy resin. The first organic sub-layer may have a smaller refractive index than the light extraction layer, such that a refractive index gradient may be formed to suppress a total reflection of light. Further, a thickness of the first organic sub-layer may be, for example, approximately 1 µm to approximately 8 µm, and a refractive index of the first organic sub-layer may be approximately 1.56.

Further, a material of the first inorganic sub-layer may include, for example, at least one of a silicon oxide, a silicon nitride, or a silicon oxynitride. The first inorganic sub-layer may have a refractive index higher than the first organic sub-layer, such that a light transmittance may be improved. Further, a material of the first inorganic sub-layer may include, for example, a silicon nitride (SiN). In some embodiments, a refractive index of the first inorganic sub-layer may be, for example, approximately 1.84. In some embodiments, a thickness of the first inorganic sub-layer may be, for example, approximately 800 nm.

In some embodiments, a material of the second organic sub-layer can include, for example, a corrugated polymer. The corrugated polymer may include a self-assembled regular array formed by at least one of polystyrene, polymethylmethacrylate (PMMA), phenolic resin, or another multi-block polymer having a similar structure. In some embodiments, a thickness of the second organic sub-layer may generally be approximately 1 µm to approximately 8 µm, and may have nearly no influence on light output. The corrugated polymer may have a periodic wrinkle structure, and may have a scattering effect on outputted light, thereby reducing a total reflection of light and improving a transmittance of light.

In some embodiments, for example, forming the encapsulation layer over the light extraction layer at S805 may include processes described below, with reference to FIG. 15. FIG. 15 illustrates a flow chart of another exemplary fabrication method for an exemplary component of top-emitting organic light-emitting device according to various disclosed embodiments of the present disclosure.

At S821, a second inorganic sub-layer is formed over the light extraction layer. The second inorganic sub-layer may be deposited over the light extraction layer by, for example, PECVD.

At S822, a third organic sub-layer is formed over the second inorganic sub-layer. For example, polymethylmethacrylate (PMMA) may be self-assembled over the second inorganic sub-layer layer-by-layer by spin coating to form a third organic sub-layer containing a corrugated polymer.

At S823, a third inorganic sub-layer is deposited over the third organic sub-layer. The third inorganic sub-layer may be deposited over the third organic sub-layer by, for example, PECVD.

In some embodiments, a material of the second inorganic sub-layer may include, for example, at least one of a silicon oxide, a silicon nitride, or a silicon oxynitride. The second inorganic sub-layer not only may prevent the solvent from penetrating into the electrode material, but also may serve to further encapsulate the electrodes and the light-emitting layer. Further, the second inorganic sub-layer may have little influence on a light transmittance.

In some embodiments, a material of the third organic sub-layer may include a corrugated polymer. For structures and properties of the third organic sub-layer, reference can be made to descriptions of structures and properties of the second organic sub-layer, e.g., shown in FIG. 2, which are not repeated here.

The third inorganic sub-layer may include, for example, at least one of a silicon oxide, a silicon nitride, or a silicon oxynitride.

In other embodiments, for example, forming a third organic sub-layer at S822 may be performed without performing S821 and S823. That is, the third inorganic sub-layer may be deposited over the light extraction layer without the second inorganic sub-layer and the third organic sub-layer in between the light extraction layer and the third inorganic sub-layer.

In the present disclosure, references can be made between embodiments of methods, components and devices. For more details about the fabrication method(s), references can be made to the corresponding descriptions of embodiments of components and devices.

The present disclosure provides a component of top-emitting OLED device. The component of top-emitting OLED device may include an anode, a light emitting layer disposed over the anode, a cathode disposed over the light-emitting layer, a light extraction layer disposed over the cathode including a metal oxide as a material, and an encapsulation layer disposed over the light extraction layer. The encapsulation layer may include a first organic sub-layer disposed over the light extraction layer and a first inorganic sub-layer disposed over the first organic sub-layer. The light extraction layer of the component of top-emitting OLED device consistent with the disclosure may include a metal oxide having a high chemical stability and a high refractive index. In the present disclosure, the light extraction layer not only may suppress an influence of moisture and oxygen on the underlying cathode, light-emitting layer, and anode, but also may improve the light transmittance through a refractive index matching between the light extraction layer and the encapsulation layer.

The foregoing description of the embodiments of the disclosure has been presented for purposes of illustration and description. It is not intended to be exhaustive or to limit the disclosure to the precise form or to exemplary embodiments disclosed. Accordingly, the foregoing description should be regarded as illustrative rather than restrictive. Obviously, many modifications and variations will be apparent to persons skilled in this art. The embodiments are chosen and described in order to explain the principles of the technology, with various modifications suitable to the particular use or implementation contemplated. It is intended that the scope of the invention be defined by the claims appended hereto and their equivalents in which all terms are meant in their broadest reasonable sense unless otherwise indicated. Therefore, the term "the disclosure," "the present disclosure," or the like does not necessarily limit the claim scope to a specific embodiment, and the reference to exemplary embodiments of the disclosure does not imply a limitation on the invention, and no such limitation is to be inferred. Moreover, the claims may refer to "first," "second," etc., followed by a noun or element. Such terms should be understood as a nomenclature and should not be construed as giving the limitation on the number of the elements modified by such nomenclature unless specific number has been given. Any advantages and benefits described may or may not apply to all embodiments of the disclosure. It should be appreciated that variations may be made to the embodiments described by persons skilled in the art without departing from the scope of the present disclosure. Moreover, no element or component in the present disclosure is intended to be dedicated to the public regardless of whether the element or component is explicitly recited in the following claims.

What is claimed is:

1. A component of top-emitting organic light-emitting device comprising:
   an anode;
   a light-emitting layer over the anode;
   a cathode over the light-emitting layer;
   a light extraction layer over the cathode, a material of the light extraction layer including an inorganic material; and
   an encapsulation layer over the light extraction layer,
   wherein the encapsulation layer has a laminated structure and includes:
      an organic sub-layer directly over the light extraction layer; and
      an inorganic sub-layer over the organic sub-layer, and
   wherein the organic sub-layer has a smaller refractive index than the light extraction layer, and
   the inorganic sub-layer has a larger refractive index than the organic sub-layer.

2. The component according to claim 1, wherein the inorganic material includes a metal oxide.

3. The component according to claim 2, wherein the metal oxide includes at least one of an aluminum oxide, a zinc oxide, a zirconium oxide, or a titanium oxide.

4. The component according to claim 1, wherein a material of the organic sub-layer includes an epoxy resin.

5. The component according to claim 1, wherein a material of the inorganic sub-layer includes at least one of a silicon oxide, a silicon nitride, or a silicon oxynitride.

6. The component according to claim 1, wherein:
the organic sub-layer is a first organic sub-layer, and
the encapsulation layer further includes a second organic sub-layer over the inorganic sub-layer, a material of the second organic sub-layer including a corrugated polymer.

7. The component according to claim 6, wherein: the corrugated polymer includes at least one of polystyrene, polymethylmethacrylate, or phenolic resin.

8. The component according to claim 6, wherein:
a thickness of the first organic sub-layer ranges from approximately 1 µm to approximately 8 µm, and
a refractive index of the first organic sub-layer is approximately 1.56.

9. The component according to claim 6, wherein:
a thickness of the inorganic sub-layer is approximately 800 nm, and
a refractive index of the inorganic sub-layer is approximately 1.84.

10. The component according to claim 6, wherein:
a thickness of the second organic sub-layer ranges from approximately 1 µm to approximately 8 µm.

11. The component according to claim 1, wherein:
a refractive index of the light extraction layer ranges from approximately 1.7 to approximately 2.1, and
a thickness of the light extraction layer is approximately 50 nm.

12. The component according to claim 1, wherein the encapsulation layer includes:
an organic sub-layer, a material of the organic sub-layer including a corrugated polymer.

13. The component according to claim 12, wherein the light extraction layer is deposited by atomic layer deposition.

14. The component according to claim 12, wherein:
the encapsulation layer further includes an inorganic sub-layer between the light extraction layer and the organic sub-layer, and
a material of the inorganic sub-layer includes at least one of a silicon oxide, a silicon nitride, or a silicon oxynitride.

15. The component according to claim 12, wherein:
the encapsulation layer further includes an additional inorganic sub-layer over the organic sub-layer, and
a material of the additional inorganic sub-layer over the organic sub-layer includes at least one of a silicon oxide, a silicon nitride, or a silicon oxynitride.

16. The component according to claim 12, wherein:
a thickness of the organic sub-layer ranges from approximately 1 µm to approximately 8 µm.

17. A top-emitting organic light-emitting diode, comprising the component according to claim 1.

* * * * *